United States Patent [19]
Ohishi et al.

[11] Patent Number: 6,002,696
[45] Date of Patent: Dec. 14, 1999

[54] LASER APPARATUS AND METHOD OF CONTROLLING THE SAME

[75] Inventors: Masahiro Ohishi; Hiroshi Koizumi; Fumio Ohtomo; Masayuki Momiuchi; Yoshiaki Goto, all of Tokyo, Japan

[73] Assignee: Kabushiki Kaisha Topcon, Tokyo, Japan

[21] Appl. No.: 08/819,258

[22] Filed: Mar. 18, 1997

[30]     Foreign Application Priority Data

Mar. 18, 1996  [JP]  Japan ..................................... 8-090572

[51] Int. Cl.$^6$ ....................................................... H01S 3/10
[52] U.S. Cl. ................................. 372/22; 372/31; 372/34
[58] Field of Search ............................... 372/321, 22, 29, 372/31, 32, 34

[56]             References Cited

U.S. PATENT DOCUMENTS 5,517,525   5/1996   Endo et al. ............................... 372/21

Primary Examiner—James W. Davie
Attorney, Agent, or Firm—Baker & Botts, L.L.P.

[57]              ABSTRACT

A laser apparatus employing a semiconductor laser or the like, and a method of controlling the laser apparatus capable of controlling an driving a temperature control unit on the basis of the sum of the respective power consumptions of the temperature control unit and a driving means so that the laser apparatus operates at a minimum power consumption. The temperature control unit included in a laser oscillator heats or cools a nonlinear optical medium, a temperature detecting means detects the temperature of the nonlinear optical medium, a power consumption detecting unit detects the respective power consumptions of the temperature control unit and the driving means, and a processing means controls and drives the temperature control unit on the basis of the sum of the respective power consumptions of the temperature control unit and the driving means.

9 Claims, 5 Drawing Sheets

LASER APPARATUS AND METHOD OF CONTROLLING THE SAME

BACKGROUND OF THE INVENTION

The present invention relates to a laser apparatus employing a semiconductor laser or the like, and a method of controlling the laser apparatus. More particularly, the present invention relates to a laser apparatus capable of controlling and driving a temperature control unit on the basis of the total power consumption of the temperature control unit and a driving means so that the laser apparatus operates at a minimum power consumption.

Laser oscillators employing a semiconductor laser have been used in various fields. Laser technology has made remarkable advancement in recent years and battery-powered outdoor laser oscillators, such as survey instruments, are applied to various fields as well as laser oscillators which use a commercial power supply. However, conventional laser oscillators consume much power, and hence the batteries of conventional battery-powered oscillators are exhausted in a relatively short operating time.

Therefore, there has been an intense demand for the development of a laser apparatus capable of emitting a laser beam at a high efficiency, of operating at a low power consumption rate and of continuously operating for a greatly extended operating time.

A laser emits a laser beam at a maximum efficiency when the peak of the gain curve of the laser coincides with the position of the longitudinal mode. Even if an optical resonator is adjusted to a most efficient condition during the assembly of the same the optical resonator changes with time to an inefficient condition due to aged deterioration.

The refractive index of a nonlinear optical medium varies with temperature and hence the quantity of output light varies with the ambient temperature.

SUMMARY OF THE INVENTION

According to the present invention, a temperature control unit included in a laser oscillator heats or cools a nonlinear optical medium, a temperature detecting means detects the temperature of the nonlinear optical medium, a power consumption detecting unit detects the respective power consumptions of the temperature control unit and a driving means, and a processing means controls and drives the temperature control unit on the basis of the sum of the respective power consumptions of the temperature control unit and the driving means.

DETAILED DESCRIPTION OF THE PREFERRED EMBODIMENT

A preferred embodiment of the present invention will be described hereinafter with reference to the accompanying drawings.

Figure 1:
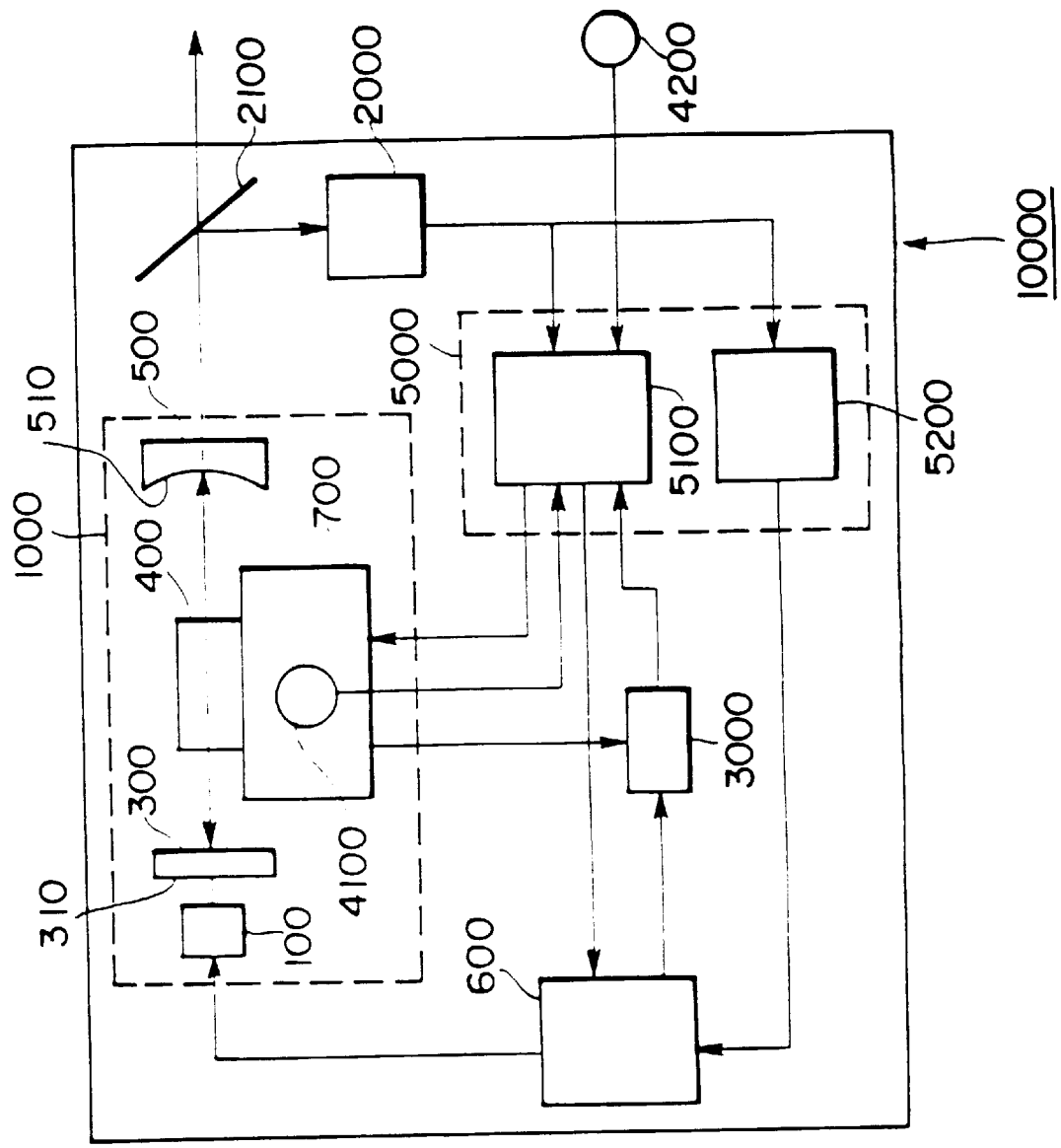
FIG. 1 is a block diagram of a laser apparatus in a preferred embodiment according to the present invention.

Referring to FIG. 1, a laser oscillator 1000 employed in a laser apparatus 10000 in a preferred embodiment according to the present invention comprises a laser light source 100, a laser crystal 300, a nonlinear optical medium 400, an output mirror 500, a laser driving unit 600 and a temperature control unit 700.

The laser light source 100, which emits laser light, is a semiconductor laser. In this embodiment, the laser light source 100 has the functions of a pump wave generator. The laser light source 100 may be a light source of any kind provided that the light source is capable of emitting laser light. The laser driving unit 600 drives the laser light source 100 so that the laser light source 100 emits pulse laser light.

The laser crystal 300 having a negative temperature characteristic amplifies laser light emitted by the laser light source 100. The laser crystal 300 is, for example, a YAG (yttrium aluminum garnet) doped with $Nd^{3+}$. YAG has oscillation lines at 946 nm, 1064 nm and 1319 nm. The laser crystal 300 need not be limited to YAG; the laser crystal 300 may be $Nd:YVO_4$ having an oscillation line at 1064 nm or Ti:Sapphire having oscillation lines in the range of 700 to 900 nm. A first dielectric reflection coating 310 is formed on a surface of the laser crystal 300 on the side of the laser light source 100. The first dielectric reflection coating 310 is highly transparent to laser light emitted by the laser light source 100 and highly reflective to light of the oscillation wavelength of the laser crystal 300 and the second harmonic of the oscillation wavelength of the laser crystal 300.

The output mirror 500 is disposed opposite to the laser crystal 300. A surface of the output mirror 500 facing the laser crystal 300 is a concave spherical surface of an optional radius and is coated with a second dielectric reflection coating 510. The second dielectric reflection coating 510 is highly reflective to the oscillation wavelength of the laser crystal 300 and is highly transparent to the second harmonic of the oscillation wavelength of the laser crystal 300.

When the first dielectric reflection film 310 of the laser crystal 300, and the output mirror 500 are used in combination to pump the laser crystal 300 by a light beam emitted by the laser light source 100, light reciprocates between the first dielectric reflection film 310 of the laser crystal 300, and the output mirror 500, so that the light can be confined for a long time to amplify the light by resonance. In this embodiment, a nonlinear optical medium 400 is inserted in an optical resonator comprising the first dielectric reflection film 310 of the laser crystal 300, and the output mirror 500. The wavelength of the outgoing laser light corresponds to a wavelength at which a longitudinal mode dependent on the optical path length of the optical resonator coincides with the gain curve of the laser.

Nonlinear optical effect will briefly be explained. A substance is subject to electric polarization when an electric field is applied thereto. The polarization is proportional to the intensity of the electric field while the intensity of the electric field is low. When highly coherent light, such as laser light, is used, the proportional relation between polarization and the intensity of the electric field is destroyed, and nonlinear polarization components proportional to the second and the third power of the intensity of the electric field become dominant.

Accordingly, the polarization caused by a light wave in the nonlinear optical medium 400 includes a component proportional to the square of the intensity of a light wavy electric field, light waves of different frequencies are coupled by nonlinear polarization, and higher harmonics of frequencies twice the frequencies of the light waves are generated. The generation of such second harmonics is called SHG (second harmonic generation).

Since the nonlinear optical medium 400 is inserted in the optical resonator comprising the laser crystal 300 and the output mirror 500, the SHG is called an internal SHG. Since the conversion output is proportional to the square of the power of the fundamental wave, the light of a high intensity confined in the optical resonator can directly be used. The nonlinear optical medium 400 is, for example, KTP (titanium potassium phosphate, $KTiOPO_4$), BBO($\beta$-lithium borate, $\beta$-$BaB_2O_4$), LBO (litium triborate, $LiB_3O_5$) or the like. A light wave of 1064 nm is converted into that of 532 nm. $KNbO_3$ (potassium niobic acid) is used for the nonlinear optical medium 400, in which a light wave of 946 nm is converted into that of 473 nm. A second harmonic of a fundamental wave can be generated.

Figure 2:
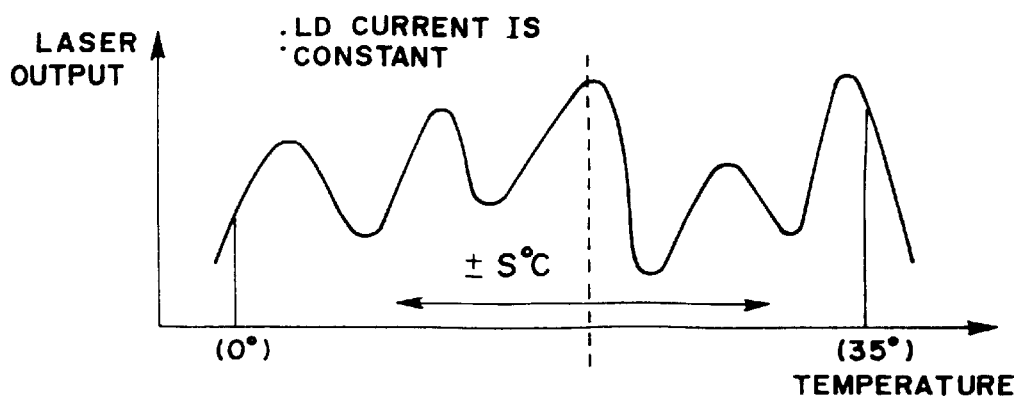
FIG. 2 is a graph showing the variation-of laser output with temperature when a constant current is supplied to a semiconductor laser serving as a laser light source.

The laser is able to emit light most efficiently when the peak of the gain curve of the laser coincides with the position of the longitudinal mode. Therefore, when assembling the optical resonator, the optical resonator is adjusted for operation at the highest efficiency. When the nonlinear optical medium 400 is inserted in the optical resonator, the efficiency of the laser is dependent on the disposition of the nonlinear optical medium 400 as well as on the laser crystal 300 and the output mirror 500. The positional relation between those three component parts must be adjusted. The refractive index of the nonlinear optical medium 400 varies with temperature. Therefore, the quantity of output light of the laser oscillator 1000 varies with the ambient temperature as shown in FIG. 2. The temperature control unit 700 keeps the nonlinear optical medium 400 at a temperature for operation at the highest efficiency to prevent the variation of the quantity of the output light. The temperature control unit 700 employs a Pelitier device for heating or cooling the nonlinear optical medium 400. The temperature control unit 700 may employ any suitable means other than the Peltier device, for heating or cooling the nonlinear optical medium 400.

Principle

FIG. 2 shows the relation between the output of the laser oscillator 1000 and the temperature of the nonlinear optical medium 400 when a constant current is supplied to the semiconductor laser included in the laser light source 100, in which the temperature of the nonlinear optical medium 400 is measured in the range of 0° C. to 35° C. on the horizontal axis and the output of the laser oscillator 1000 is measured on the vertical axis. The output of the laser oscillator 1000 does not vary linearly with the temperature of the nonlinear optical medium 400, but varies in a curve having a plurality of peaks.

Figure 3:
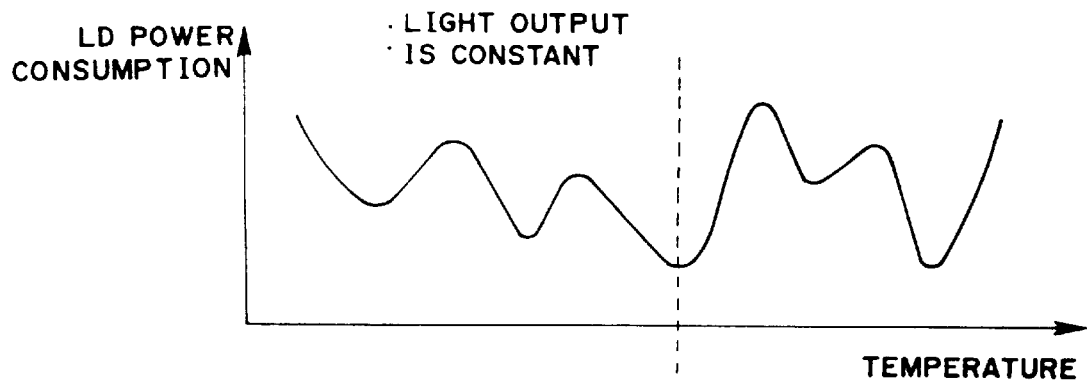
FIG. 3 is a graph showing the variation of power consumption of a semiconductor laser serving as a laser light source with temperature when the output of a laser oscillator is kept constant.

FIG. 3 shows the relation between the power consumption of the semiconductor laser included in the laser light source 100 and the temperature of the nonlinear optical medium 400 when the output of the laser oscillator 1000 is kept constant, in which the temperature of the nonlinear optical medium 400 is measured on the horizontal axis and the power consumption of the semiconductor laser is measured on the vertical axis. The power consumption of the semiconductor laser does not vary linearly with the temperature of the nonlinear optical medium 400, but varies in a curve having a plurality of peaks.

Figure 4:
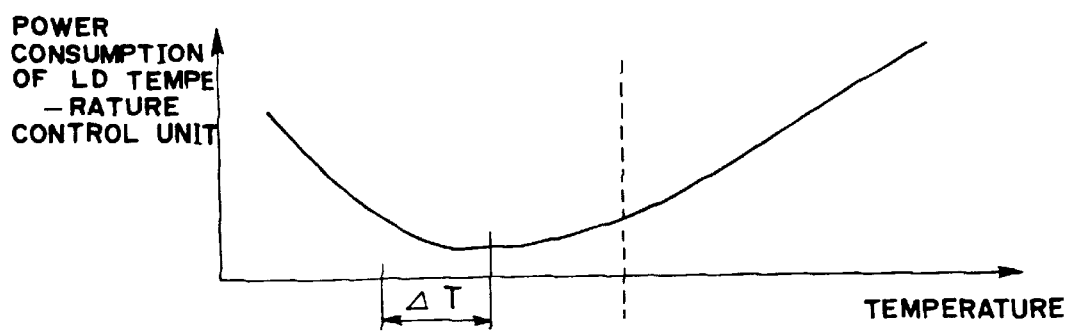
FIG. 4 is a graph showing the variation of the power consumption of the temperature control unit, i.e., a temperature control means, with temperature.

FIG. 4 shows the variation of the power consumption of the temperature control unit 700 with the temperature of the nonlinear optical medium 400, in which the temperature of the nonlinear optical medium 400 is measured on the horizontal axis and the power consumption of the temperature control unit 700 is measured on the vertical axis. The power consumption of the temperature control unit 700 reaches a minimum at a temperature. In FIG. 4, the ambient temperature is $\alpha°$, and a temperature rise in the nonlinear optical medium 400 caused by heat generated by the excited laser diode is $\Delta T°$. Therefore, the curve shown in FIG. 4 is translated along the horizontal axis if the ambient temperature changes.

Figure 5:
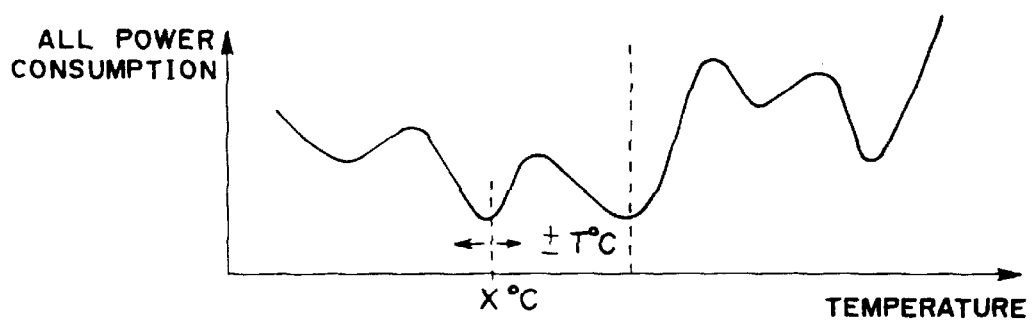
FIG. 5 is a graph showing the variation of total power consumption, i.e., the sum of respective power consumptions of the semiconductor laser and the temperature control unit, with temperature.

FIG. 5 is a graph showing a curve obtained by adding the curve of FIG. 3 indicating the variation of the power consumption of the semiconductor laser included in the laser light source 100 with temperature, and the curve of FIG. 4 indicating the variation of the power consumption of the temperature control unit 700 with temperature. As is obvious from FIG. 5, the total power consumption does not necessarily reach a minimum even if the power consumption of the semiconductor laser shown in FIG. 3 is small when the power consumption of the temperature control unit 700 is large. It is desirable to operate the optical oscillator 1000 at a temperature at which the total power consumption reaches a minimum.

Embodiment

The electrical configuration of the laser apparatus 10000 embodying the present invention will be described with reference to FIG. 1. The laser apparatus 10000 comprises the laser oscillator 1000, a laser light detecting unit 2000, a power consumption detecting unit 3000, a temperature detector 4000 and a processing unit 5000.

The laser oscillator 1000 comprises the laser light source 100, the laser crystal 300, the nonlinear optical medium 400, the output mirror 500, the laser driving unit 600 and the temperature control unit 700.

The laser light detecting unit 2000 receives part of laser light emitted by the laser oscillator 1000 and reflected by a half mirror 2100 to measure the intensity of the laser light. The laser light detecting unit 2000 may employ any photosensor capable of measuring the intensity of light.

The power consumption detecting unit 3000 is connected to the laser driving unit 600 and the temperature control unit 700 to measure the respective power consumptions of the laser light source 100 and the temperature control unit 700. The power consumption of the laser oscillator 1000 is calculated on the basis of measured currents supplied to the laser driving unit 600 and the temperature control unit 700. The power consumption may be determined by any other suitable method.

The temperature detecting unit 4000 comprises a first temperature sensor 4100 for measuring the temperature of the temperature control unit 700, and a second temperature sensor 4200 for measuring the ambient temperature. The temperature sensors 4100 and 4200 may be of any suitable type.

The processing unit 5000 comprises, as principal components, a CPU, a RAM and a ROM, and carries out control operations and arithmetic operations. The processing unit 5000 includes a temperature control unit controlling and driving unit 5100 and a laser driving and controlling unit 5200.

The temperature control unit controlling and driving unit 5100 controls and drives the temperature control unit 700, and is capable of heating or cooling the nonlinear optical medium 400 at a desired temperature.

The laser driving and controlling unit 5200 controls the laser driving unit 600 to regulate the output of the laser light source 100.

Figure 6:
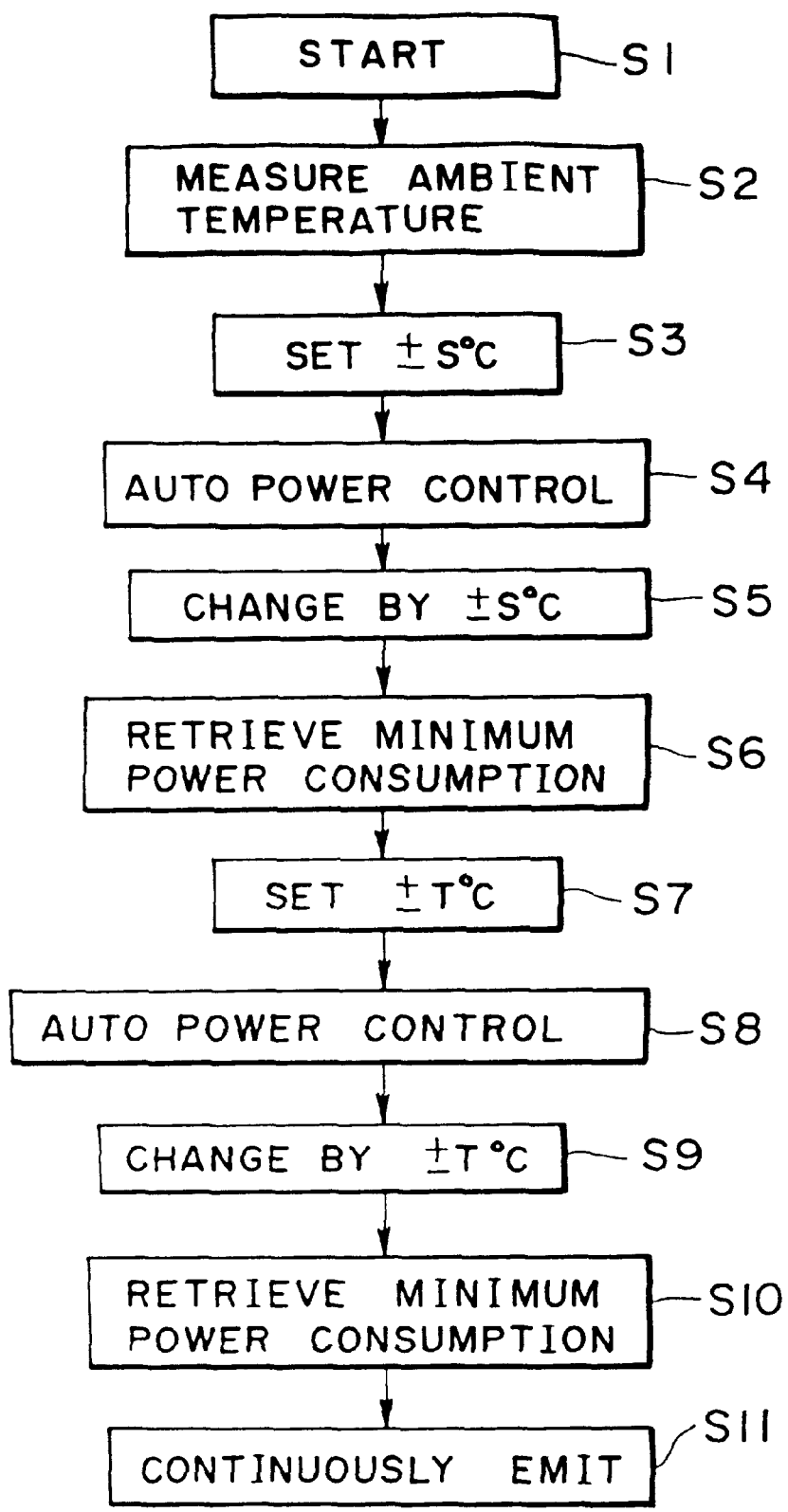
FIG. 6 is a flow chart of assistance in explaining the operation of the laser apparatus embodying the present invention.

The operation of the laser apparatus 10000 thus constructed will be described with reference to FIG. 6. The laser apparatus 10000 is connected to a power source in step S1 to start the laser apparatus 10000. The laser driving and controlling unit 5200 controls the laser driving unit 600 to make the laser light source 100 emit laser light for pumping the laser oscillator 1000. In step S2, the processor 5000 receives temperature data on the ambient temperature from the second temperature sensor 4200. Then in step S3, the thus pumped laser oscillator 1000, i.e., an optical resonator, emits a laser beam. The processor 5000 calculates a temperature change $\pm S°$ C. by which the temperature of the nonlinear optical medium 400 is to be raised or reduced on the basis of a rise $\Delta T$ in the temperature of the nonlinear optical medium 400 caused by heat generated by the excited laser diode. In this embodiment, the temperature change S is 7° C. If the ambient temperature is 16° C. and $\Delta T=4°$ C., the temperature of the nonlinear optical medium 400 is regulated at temperatures in the range of 20° C. $\pm 7°$ C., i.e., 13° C. to 27° C. by heating or cooling the nonlinear optical medium 400.

In step S4, the laser oscillator 1000 is controlled in an automatic power control mode, in which the laser driving and controlling unit 5200 of the processor 5000 controls the laser driving unit 600 on the basis of a detection signal provided by the laser light detecting unit 2000 to drive the laser light source 100 so that the laser oscillator 1000 emits a laser beam of a fixed intensity.

In step S5, the temperature control unit controlling and driving unit 5100 controls and drives the temperature control unit 700 while the laser beam of the fixed intensity is emitted continuously so that the variation of the temperature of the nonlinear optical medium 400 is within $\pm S°$ C. The processor 5000 receives data from the power consumption detecting unit 3000. The power consumption $W_1$ of the laser light source 100 and the power consumption $W_2$ of the temperature control unit 700 are measured, and the relation between the temperature of the nonlinear optical medium 400 and the respective power consumptions $W_1$ and $W_2$ of the laser light source 100 and the temperature control unit 700 is determined. In step S6, a minimum power consumption of the laser apparatus 10000 is retrieved. The processor 5000 calculates $W=W_1+W_2$, and determines a temperature $X°$ C. of the nonlinear optical medium 400 at which W attains a minimum.

In step S7, a temperature change $T°$ C. by which the temperature of the nonlinear optical medium 400 is raised or reduced from the temperature $X°$ C. In this embodiment, $\pm T=2°$ C. If $X=19°$ C., the nonlinear optical medium 400 is heated or cooled at temperatures in the range of 19° C. $\pm 2°$ C., i.e., 17° C. to 21° C.

The laser oscillator 1000 is driven continuously in the automatic power control mode in step S8, and the temperature control unit controlling and driving unit 5100 controls and drives the temperature control unit 700 to limit the variation of the temperature of the nonlinear optical medium 400 within $\pm T$ while the laser beam of the fixed intensity is emitted continuously in step S9. The processor 5000 receives data from the power consumption detecting unit 3000. The respective power consumptions of the laser light source 100 and the temperature control unit 700 are measured, and the relation between the temperature of the nonlinear optical medium 400 and the respective power consumptions $W_1$ and $W_2$ of the laser light source 100 and the temperature control unit 700 is determined.

In step S10, a minimum power consumption of the laser apparatus 10000 is retrieved. The processor 5000 calculates $W=W_1+W_2$, and determines a temperature $Y°$ C. of the nonlinear optical medium 400 at which W attains a minimum. If the temperature $Y°$ C. is calculated repeatedly, the temperatures of the nonlinear optical medium 400 at which the power consumption is a minimum can sequentially be determined even if the temperature at which the power consumption of the laser apparatus 10000 is a minimum varies with time. In step S11, the temperature $Y°$ C. is calculated repeatedly, and if the temperature control unit controlling and driving unit 5100 controls the temperature control unit 700 so that the temperature of the nonlinear optical medium 400 coincides with the temperature $Y°$ C., the power consumption of the laser apparatus 1000 attains a minimum.

The temperatures $S°$ C. and $T°$ C. may be determined optionally. Since the laser apparatus 10000 narrows down the range of temperature retrieval and time necessary for temperature retrieval can be reduced to the least possible time. Rough measurement is performed quickly in the range $\pm S°$ C., and fine retrieval is performed slowly in the range $\pm T°$ C. It must be noted that accurate measurement cannot be achieved when effort is made to measure temperature in a wide temperature range quickly, because the temperature of the nonlinear optical medium 400 is not uniform. The temperature of the nonlinear optical medium 400 may be determined by more than two steps instead of by two steps using $\pm S°$ C. and $T°$ C. Since the temperature change by temperature retrieval causes the condition of the optical resonator to change, temperature retrieval may be ended after an appropriate number of repetition of a temperature retrieval operation when a more stable laser beam is necessary. The ambient temperature may be measured continuously and the temperature retrieval operation may be resumed when it is decided that the temperature retrieval operation is necessary.

The relation between the temperature of the nonlinear optical medium 400 and power consumption may be determined for a temperature range of, for example, 0° C. to 35° C., data representing the relation may be stored in a storage device included in the processor 5000, and the temperature control unit controlling and driving unit 5100 may control the temperature control unit 700 on the basis of the data stored in the storage device. When controlling the temperature control unit 700 in such a manner, the temperature retrieval operation using $\pm S°$ C. may be omitted. The aged deterioration of the optical resonator can be detected through the comparison of the current measured value with the data stored in the storage device included in the processor 5000, and a warning can be given to notify the user of the aged deterioration. The previously stored data may be replaced with the newly measured data for updating. Characteristics such as shown in FIG. 4 may previously be stored in the storage device.

In this embodiment, the set environment is the temperature of the nonlinear optical medium 400, and the temperature control unit 700 is a set environment changing means. The set environment is not limited to temperature, but the same may be the disposition of the optical resonator or the nonlinear optical medium. The set environment changing means may be a mechanical means capable of moving the optical resonator or the nonlinear optical medium.

Figure 7:
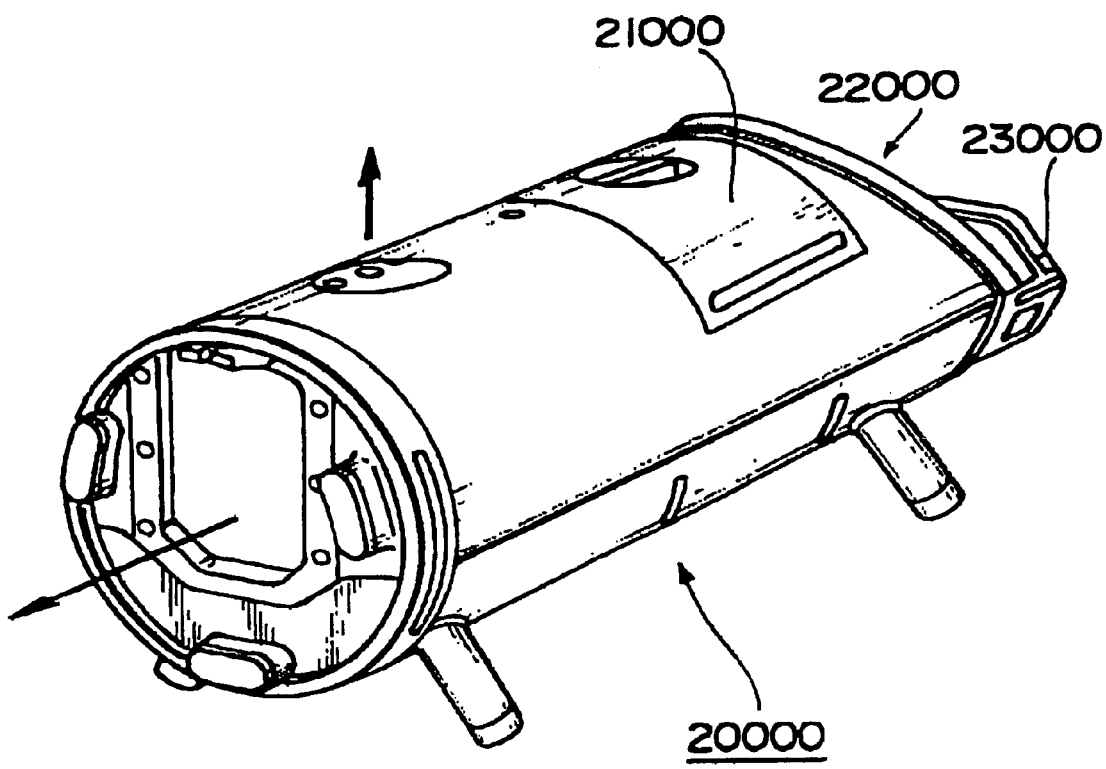
FIG. 7 is a perspective view of a pipe laser apparatus employing the laser apparatus in the preferred embodiment.

The laser apparatus 10000 is applicable to a pipe laser apparatus 20000 shown in FIG. 7. The pipe laser apparatus 20000 is internally provided with the laser apparatus 10000 and is capable of emitting guide beams in horizontal directions and vertical directions. A power supply is loaded into a battery box 21000 formed in the pipe laser apparatus 20000. The pipe laser apparatus 20000 is fixedly provided with a control panel 22000 and a handle 23000 on one end thereof.

As is obvious from the foregoing description, according to the present invention, the optical resonator comprises at least the laser crystal and the output mirror, the nonlinear optical medium for producing the second harmonic is inserted into the optical resonator, the laser light source pumps the optical resonator, and the driving means drives the laser light source. The set environment changing means changes the set environment for the optical resonator and the nonlinear optical medium, the processing means controls and drives the set environment changing means so that the laser oscillator is able to operate at a high efficiency. Accordingly, the laser oscillator can be operated at the highest efficiency.

Furthermore, the temperature control unit of the laser oscillator heats or cools the nonlinear optical medium, the temperature detecting means detects the temperature of the nonlinear optical medium, the power consumption detecting means detects the respective power consumptions of the temperature control unit and the driving means, and the processing means controls and drives the temperature control unit on the basis of the sum of the respective power consumptions of the temperature control unit and the driving means. Therefore, the laser apparatus emits laser light at the least power consumption, and the laser oscillator can automatically be regulated in the best condition regardless of aged deterioration.

What is claimed is:

1. A laser apparatus comprising: a laser oscillator including an optical resonator comprising at least a laser crystal and an output mirror, a nonlinear optical medium inserted in the optical resonator for second harmonic generation, a laser light source for pumping the optical resonator, and a driving means for driving the laser light source; a temperature control unit for heating or cooling the nonlinear optical medium; and a processing means for controlling and driving the temperature control unit; the processing means controlling the temperature control unit on the basis of a relation between a laser output and a power consumption such that the power consumption is minimized.

2. The laser apparatus according to claim 1, further comprising a laser light detecting unit for detecting the intensity of the laser light emitted by the laser oscillator, wherein the temperature control unit is responsive to the ambient temperature in addition to the temperature of the nonlinear optical medium, and the processing means further controls and drives the driving means on the basis of a detection signal provided by the laser light detecting means so that the intensity of the laser light emitted by the laser oscillator is kept constant.

3. A laser apparatus comprising: a laser oscillator including an optical resonator comprising at least a laser crystal and an output mirror, a nonlinear optical medium inserted in the optical resonator for second harmonic generation, a laser light source for pumping the optical resonator, and a driving means for driving the laser light source; a temperature control unit for heating or cooling the nonlinear optical medium; a temperature detecting means for detecting the temperature of the nonlinear optical medium; a power consumption detecting unit for detecting the respective power consumptions of the temperature control unit and the driving means; and a processing means for controlling and driving the temperature control unit on the basis of the sum of the respective power consumptions of the temperature control unit and the driving means.

4. The laser apparatus according to claim 3, further comprising a laser light detecting unit for detecting the intensity of the laser light emitted by the laser oscillator, wherein the temperature detecting means detects the ambient temperature in addition to the temperature of the nonlinear optical medium, and the processing means controls and drives the driving means on the basis of a detection signal provided by the laser light detecting means so that the intensity of the laser light emitted by the laser oscillator is kept constant.

5. The laser apparatus according to claim 3 or 4, wherein the processing means retrieves a temperature $X°$ C. for the nonlinear optical medium at which the sum of the respective power consumptions of the temperature control unit and the driving means attains a minimum in a temperature range of $±S°$ C. for heating or cooling by the temperature control unit, retrieves a temperature $Y°$ C. for the nonlinear optical medium at which the sum of the respective power consumptions of the temperature control unit and the driving means attains a minimum in a temperature range of $±T°$ C. around the temperature $X°$ C., and keeps the temperature of the nonlinear optical medium at the temperature $Y°$ C.

6. The laser apparatus according to claim 5, wherein data on the relation between temperature, and the respective power consumptions of the temperature control unit and the driving means is stored in a storage device included in the processing means.

7. A method of controlling a laser apparatus provided with a laser oscillator comprising an optical resonator including at least a laser crystal and an output mirror, a nonlinear optical medium inserted in the optical resonator for second harmonic generation, a laser light source for pumping the optical resonator, and a driving means for driving the laser light source; said method comprising heating or cooling the nonlinear optical medium by the temperature control unit, and controlling and driving the temperature control unit on the basis of the sum of the respective power consumptions of the temperature control unit and the driving means so that the power consumption of the laser oscillator attains a minimum.

8. The method according to claim 7, wherein the laser light detecting unit detects the intensity of laser light emitted by the laser oscillator, and the driving means is controlled and driven on the basis of a detection signal provided by the laser light detecting unit so that the intensity of the laser light emitted by the laser oscillator is kept constant.

9. The method according to claim 7 or 8, wherein a first process for retrieving a temperature $X°$ C. for the nonlinear optical medium at which the sum of the respective power consumptions of the temperature control unit and the driving means attains a minimum in a temperature range of $±S°$ C. for heating or cooling by the temperature control unit, and a second process for retrieving a temperature Y° C. for the nonlinear optical medium at which the sum of the respective power consumptions of the temperature control unit and the driving means attains a minimum in a temperature range of ±T° C. around the temperature X° C. are executed successively to keep the temperature of the nonlinear optical medium at the temperature Y° C.

* * * * *